United States Patent [19]
Kobayashi et al.

[11] Patent Number: 5,142,791
[45] Date of Patent: Sep. 1, 1992

[54] APPARATUS FOR POSITIONING SAMPLE

[75] Inventors: Toshinori Kobayashi; Masahiro Tsunoda; Takayasu Furukawa, all of Katsuta; Isao Kobayashi, Chiyoda, all of Japan

[73] Assignee: Hitachi, Ltd., Tokyo, Japan

[21] Appl. No.: 709,317

[22] Filed: Jun. 3, 1991

[30] Foreign Application Priority Data

Jun. 2, 1990 [JP] Japan .................. 2-145141

[51] Int. Cl.$^5$ .................. B25H 1/00; B23Q 16/00
[52] U.S. Cl. .................. 33/573; 33/1 M; 33/568
[58] Field of Search .................. 33/573, 1 M, 568; 359/393, 391

[56] References Cited

U.S. PATENT DOCUMENTS

| | | | |
|---|---|---|---|
| 3,241,243 | 3/1966 | Speer | 33/1 M |
| 3,555,916 | 1/1971 | Santy | 33/568 |
| 3,727,471 | 4/1973 | Botos | 33/811 |
| 3,918,167 | 11/1975 | Gerber | 33/1 M |
| 4,139,948 | 2/1979 | Tsuchiya et al. | 33/568 |
| 4,766,674 | 8/1988 | Zanier et al. | 33/1 M |
| 4,995,277 | 2/1991 | Yanagisawa | 33/1 M |

FOREIGN PATENT DOCUMENTS 74601 5/1982 Japan .................. 33/573

Primary Examiner—William A. Cuchlinski, Jr.
Assistant Examiner—C. W. Fulton
Attorney, Agent, or Firm—Antonelli, Terry Stout & Kraus

[57] ABSTRACT

An apparatus for positioning a sample comprises a fine adjustment stage and a coarse adjustment stage. The fine adjustment stage is held by three Z axis fine adjustment driving structures above the first base. The fine adjustment stage has a number of through holes. The fine adjustment stage is provided X and Y axes fine adjustment driving structures other than the Z axis fine adjustment driving structures. The coarse adjustment stage comprises the second base which is provided above the first base and a number of protrusions which are provided dispersively on the second base. The coarse adjustment stage is connected to X and Y axes coarse adjustment driving structures through flexible and elastic members. The sectional areas of the protrusions are selected to a size which is movable freely within the through holes, respectively. By adjusting the Z axis fine adjustment driving structures, a sample hold base is held either the coarse adjustment stage or the fine adjustment stage.

24 Claims, 1 Drawing Sheet

APPARATUS FOR POSITIONING SAMPLE

FIELD OF THE INVENTION

The present invention relates to an apparatus for positioning a sample, for instance, in a reduction projection aligner or an electron beam lithography system.

BACKGROUND OF THE INVENTION

This invention relates to an apparatus for positioning a sample. There has been a demand for an apparatus having a high accuracy in positioning the sample and having a short time for positioning or manufacturing the sample. For attaining this object, conventional apparatuses for positioning a sample have utilized a stage with a coarse adjustment driving structure and with a fine adjustment driving structure for stepwise moving the sample a fine adjustment for positioning the sample utilizes the fine adjustment driving structure after a coarse adjustment utilizing a coarse adjustment driving structure for positioning the sample.

For instance, an apparatus for positioning a sample is disclosed in Japanese Laid-Open Patent No. 53-64478; one of the inventors is the same as that of the present invention; Japanese Laid-Open Patent No. 53-64478 is entitled "Apparatus for positioning sample" and was published on Jun. 8, 1978. This reference discloses that a fine adjustment stage and the driving structure are able to move along three dimensions corresponding to X, Y and Z axes on a coarse adjustment stage which is also movable along the dimensions of the X, Y and Z axes.

Japanese Laid-Open Patent No. 2-13915 entitled "Sample move apparatus, sample move system and semiconductor manufacture apparatus" was published on May 29, 1990 and discloses in FIG. 1 thereof that a fine adjustment stage, which is able to move along the three dimensions corresponding to the X, Y and Z axes, finely rotates in a plane containing the X and Y axes and moves along a fine slope towards the upper and lower directions, is formed with one through hole along the upper and lower directions at the stage, and a coarse adjustment stage, which is movable along the X, Y and Z axes within the through hole and is independent from the fine adjustment stage.

The apparatus of Japanese Laid-Open Patent No. 2-13915 changes the upper and lower positional relationship between the fine adjustment stage and the coarse adjustment stage through the Z axis driving structure and passes a sample hold base mounted on either the fine adjustment stage or the coarse adjustment stage from the fine adjustment stage to the coarse adjustment stage and vice versa. As the sample is positioned by the coarse adjustment stage, the upper surface of the coarse adjustment stage is elevated higher than the upper surface of the fine adjustment stage, and the coarse adjustment stage adsorbs and holds the sample hold base through chucks. As the sample is positioned by the fine adjustment stage, the upper surface of the fine adjustment stage is elevated higher than the coarse adjustment stage, and the fine adjustment stage holds the sample hold base for positioning the sample and positions the sample to each direction.

The apparatus of Japanese Laid-Open Patent No. 2-13915 does not mount the fine adjustment stage on the coarse adjustment stage. Although the apparatus of Japanese Laid-Open Patent No. 53-64478 mounts the fine adjustment stage on the coarse adjustment stage.

The apparatus of Japanese Laid-Open Patent No. 2-13915 independently moves the coarse adjustment stage from the fine adjustment stage. Accordingly, the apparatus of Japanese Laid-Open Patent No. 2-13915 moves the coarse adjustment stage with a light load, and the starting current and driving current of the driving structure is small. Thus, the power consumption and generated heat amount of the apparatus is small. Correspondingly an air draft caused by the generated heat of the apparatus is small so that an error in the length measurement by using a laser is small. However, the prior arts require the following improvements.

Recently, there has been a tendency to make the sample, for instance a wafer, to a larger size such as 8inches; correspondingly the sample hold base must also be made to large size, and an exposure area of the sample is expanded so that the range of movement of the sample hold base is also expanded.

In such a larger apparatus, when the wafer is positioned by using the apparatus illustrated by Japanese Laid-Open Patent No. 2-13915, the coarse adjustment stage moves the sample hold base first stepwise, then the sample hold base is passed from the coarse adjustment stage to the fine adjustment stage for a fine positioning of the sample hold base. At this time, the coarse adjustment stage is returned to the initial position in which the coarse adjustment stage is not moved. Repeating the above mentioned operation by using the coarse adjustment stage and the fine adjustment stage, the exposure to the sample and the electron beam lithography to the sample take place.

When the coarse adjustment stage is moved stepwise, the positional relationship between the coarse adjustment stage and the fine adjustment stage is varied. Accordingly, the coarse adjustment stage does not always hold or chuck the center of the sample hold base or the periphery of the center, and sometimes the coarse adjustment stage holds or chucks merely one end portion of the sample hold base.

When the sample hold base is a larger scale, and the coarse adjustment stage holding the sample hold base chucks the portion of one end of the sample hold base, the coarse adjustment stage or its supporting structure is deflected as a result of the weight itself so that the sample hold base or the sample mounted on the sample hold base is badly influenced by the deflection.

The large-scaled wafer or sample hold base causes the large-scaled chuck structure of the coarse adjustment stage to suffer additional problems. When a large-scaled electromagnetic chuck is used for holding the sample hold base, the generated quantity of heat caused by the driving current of the apparatus increases. When the generated heat is transferred to the sample hold base in expanding the sample hold base thermally, the positioning of the sample hold base is adversely effected. The air fluctuation above the light passage from the laser length measurement equipment, which is generated by the heat of the equipment, prevents the equipment from obtaining an accurate measurement of the length.

When the coarse adjustment stage is supported at one point, which is not the center of the stage, and is advanced directly in the directions of the X and Y axes, a rotational force is applied to the coarse adjustment stage for rotating the stage around one supporting point of the sample hold base.

SUMMARY OF THE INVENTION

An object of the present invention is increase the accuracy for positioning a sample by a positioning apparatus.

Another object of the present invention is to prevent the transmission of vibration along the X and Y axes of the driving structures of the coarse adjustment stage to the fine adjustment stage through a frame of the apparatus for positioning the sample and the driving structure of the fine adjustment stage, and shortening the time which is necessary for positioning the sample and the processing time of the sample.

For attaining the first object, the present invention includes the follows:

Namely, the apparatus of the present invention includes a coarse adjustment stage which is movable in at least two-dimensions along the X and Y axes, and a fine adjustment stage which is movable in three-dimensions. Fundamentally, these coarse adjustment stage and fine adjustment stage are independent from each other and have no mechanical connection.

Further, the coarse adjustment stage includes protrusions for supporting the sample hold base. The protrusions are provided on an upper surface of a base which is supported by the coarse adjustment driving structure and dispersed on the surface, respectively. On the contrary, the fine adjustment stage is provided a number of through holes. Each protrusion is arranged within a space or a through hole of the fine adjustment stage. The lower surface of the fine adjustment stage faces the upper surface of the base of the coarse adjustment stage. By arranging the protrusions dispersively within the through holes, respectively, these protrusions are activated as the coarse adjustment stage as mentioned later.

Namely, the coarse adjustment stage and the fine adjustment stage change the relative level relationship with respect to the coarse adjustment stage and the fine adjustment stage through either one of the Z axis driving structures of the coarse adjustment stage or the fine adjustment stage and passes the sample hold base from the coarse adjustment stage to the fine adjustment stage and vice versa by changing the heights of the upper surfaces of the protrusions of the coarse adjustment stage and the fine adjustment stage relatively.

To obtain the second object of the invention, the present invention retains the above-mentioned resolving means of the first object of the invention as a preamble of the resolving means of the second object of the present invention. The coarse adjustment driving structures of the X and Y axes of the coarse adjustment stage are arranged separately from the frame supporting the fine adjustment stage. These coarse adjustment driving structures and coarse adjustment stage are connected through connection materials.

As an application of the resolving means of the second object, the coarse adjustment stage is supported by the Z axis coarse adjustment driving structure other than by the X and Y axes coarse adjustment driving structures. In this case, the X and Y axes coarse adjustment driving structures and the coarse adjustment stage are connected through flexible and elastic members.

In accordance with the resolving means of the first object, when the fine adjustment stage and the coarse adjustment stage are relatively moved up and down, the upper surfaces of the protrusions of the coarse adjustment stage can be higher than the upper surface of the fine adjustment stage, or the upper surface of the fine adjustment stage can be higher than the upper surfaces of the protrusions of the coarse adjustment stage.

When the position of the sample is coarsely adjusted, the sample hold base is retainedly to the protrusions. Next, the coarse adjustment stage or the sample hold base is stepwise moved by the coarse adjustment driving structures.

After the sample hold base passes from the coarse adjustment stage to the fine adjustment stage, the necessary fine adjustments, for instance the fine adjustment in the direction of $\Delta X$, $\Delta Y$ and $\Delta Z$ of the rotation angle $\Delta\theta$ of the plane including the X and Y axes and inclination angle $\Delta\lambda$ of the up and down directions, take place. At this time, the coarse adjustment stage is returned to the initial position.

By repeating the above-mentioned operations, the relative position between the sample hold base and the coarse adjustment stage are changed.

Since the sample hold base is held by the protrusions which are dispersed on the base of the coarse adjustment stage, even when the relative position between the sample hold base and the coarse adjustment stage are changed, the problems of the one end portion of the sample hold base being held by one protrusion of the coarse adjustment stage as in the conventional apparatus can be prevented.

Accordingly, the apparatus of the present invention can prevent the occurrence of the distortion caused by the overhang of the sample hold base as explained above.

When the coarse adjustment stage is directly advanced along the directions of the X and Y axes, the coarse adjustment stage does not generate the rotation force thereto, since the coarse adjustment stage supports the sample hold base by the protrusions of the coarse adjustment stage.

When the coarse adjustment stage holds the sample hold base by the chucks attached to the protrusions, the dispersed chucks adsorb the sample hold base, respectively.

When electromagnetic chucks replace the chucks, since the chucks are attached to the dispersed protrusions on the base, the generated heat generated by the chucks is small compared with the conventional apparatus in which only one chuck is used. The deformation caused by the thermal expansion of the sample hold base can be prevented, and the fluctuation of air caused by the generated heat of the electromagnetic chucks is not generated which prevents the error of the laser length measurement caused by the fluctuation of air.

By each function mentioned above, high accurate positioning of the sample can be obtained.

According to the resolving means in accordance with the second object of the invention, since the driving structures of the X and Y axes of the coarse adjustment stage are separated from the frame, the vibrations from the driving structures are not transferred to the sample hold base during the movement of the coarse adjustment stage, so that the fine positioning of the sample can occur by the fine adjustment stage immediately after the coarse adjustment of the sample is taken place, and the necessary time for positioning the sample can be shorten.

When the coarse adjustment driving structures of the X and Y axes and the coarse adjustment stage are connected by the flexible and elastic members and the coarse adjustment stage is moved along the Z axis direction, the coarse adjustment stage is not affected by the movement, since the vibration caused by the movement can be adsorbed using elastic deformation of the elastic member.

DETAILED DESCRIPTION OF THE PREFERRED EMBODIMENT

Figure 1:
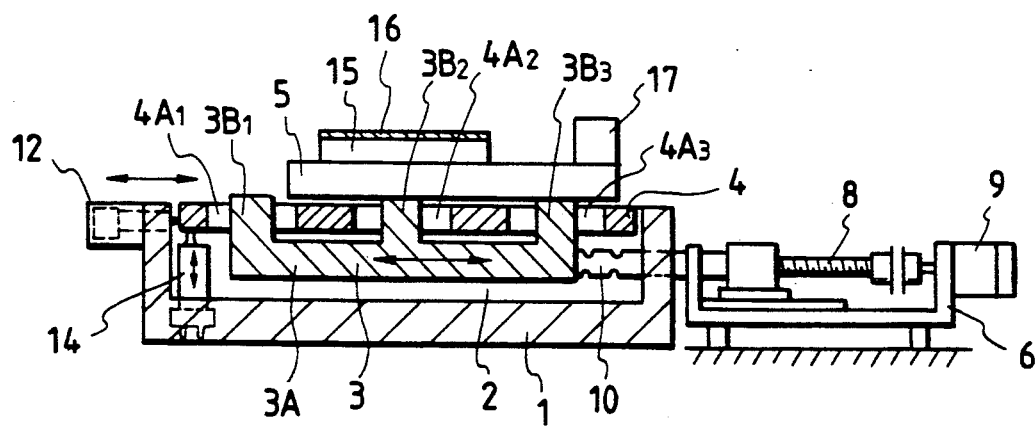
FIG. 1 is a longitudinal section view of one feature of an apparatus for positioning a sample of the present invention.
Figure 2:
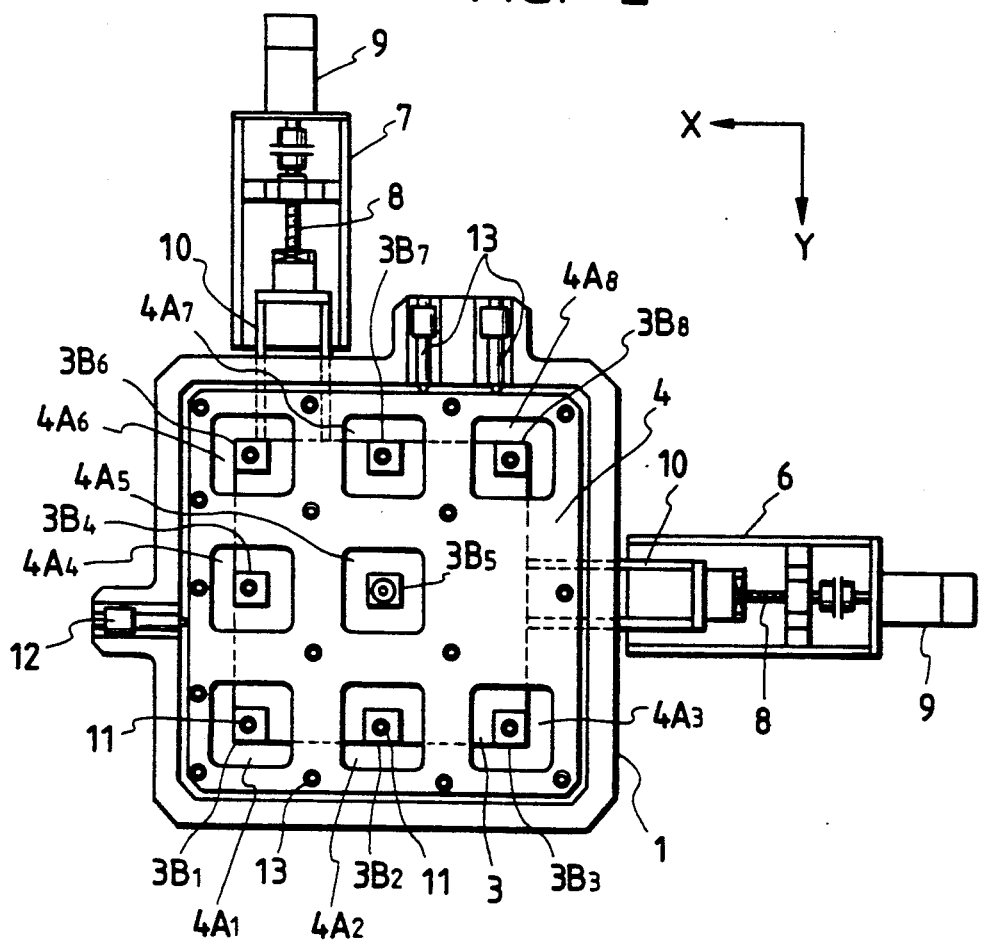
FIG. 2 is a partial upper surface view of the feature as shown in FIG. 1.

Referring to FIGS. 1 and 2, 1 denotes the frame of the apparatus. The coarse adjustment stage 3 and fine adjustment stage 4 are provided within an inside space 2 of the frame 1.

The coarse adjustment stage 3 includes a rectangular shaped base 3A and protrusions $3B_1, \ldots 3B_n$, which are provided dispersively on the upper surface of the base 3A. In the embodiment shown in FIG. 2, the protrusions includes 8 parts of $3B_1, \ldots, 3B_8$. In FIG. 2, the sample hold base 5 mentioned later is abridged. As shown in FIG. 2, coarse adjustment stage 3 is connected to X axis coarse adjustment driving structure 6 at one side of stage 3A and the Y axis coarse adjustment driving structure at another side of stage 3A through the flexible and elastic member 10, respectively. The coarse adjustment stage 3 is also supported by the Z axis coarse adjustment driving structure (not shown) which is located under connecting member 10 and base 3A.

The X axis coarse adjustment driving structure 6 and the Y axis coarse adjustment driving structure 7 of the embodiment comprise screw drivers of screw rods 8 and servomotors 9, respectively, are separated from the frame 1. The course adjustment stage 3 is stroked within ±25 mm, and has a stop accuracy of ±2 μm. The screw rod 8 passes through the frame 1. The tip of the rod 8 and the coarse adjustment stage 3 are connected through flexible connecting member 10 as mentioned above. On the upper surfaces of protrusions $3B_1$–$3B_8$, electromagnetic chucks 11 of each protrusion are provided.

The fine adjustment stage 4 is shaped as a rectangle and has large area compared with the coarse adjustment stage 3. The fine adjustment stage 4 has a number of through holes 4A, which penetrates stage 4 in the upper and lower directions. The through holes 4A include 8 holes of $4A_1$–$4A_8$ corresponding to protrusions $3B_1$–$3B_8$. These through holes are dispersed through the fine adjustment stage 4.

The base 3A of the coarse adjustment stage 3 is located under the fine adjustment stage 4. The protrusions $3B_1$–$3B_8$ are inserted into through holes $4A_1$–$4A_8$.

The fine adjustment stage 4 is supported by the X axis fine adjustment driving structure 12, the Y axis fine adjustment driving structure 13 and the Z axis fine adjustment driving structure 14. These fine adjustment driving structures of X, Y and Z axes are formed, for instance, by actuators of piezoelectric elements. Each piezoelectric element is able to move within 80 μm. The Z axis fine adjustment driving structures support the fine adjustment stage 4 at three points. By differentiating the displacement amounts of the three Z axis fine adjustment driving structures, the control of inclination $\Delta\lambda$ in the up and down directions is realized. By cooperating the X axis fine adjustment driving structure 12 with the Y axis fine adjustment driving structure, the fine rotation angle $\Delta\theta$ can be obtained in the plane containing the X and Y axes. By using the piezoelectric actuators of the structures 12, 13 and 14, the fine adjustments of $\Delta X$ and $\Delta Y$ is adjusted within ±0.02 μm; $\Delta Z$ is adjusted within ±0.1 μm; $\Delta\theta$ is adjusted within ±0.02 μm/20 mm, and the inclination (tilt) of $\Delta\lambda$ is adjusted within ±0.1 μm/°mm.

By assembling these stages 3 and 4, each stage moves independently. Specifically, coarse adjustment stage 3 and fine adjustment stage 4 are moved in two directions corresponding to the X and Y axes and maintaining the space between the protrusions 3B and the fine adjustment stage 4, and in the direction corresponding to the Z axis. A number of electromagnetic chucks 13 are dispersed on the upper surface of the fine adjustment stage 4. Incidentally, the electromagnetic chucks 13 can be omitted. Since the fine adjustment stage 4 is moved in the range of submicrons, sample hold base 5 is maintained in a fixed situation without chucks, even if small shocks are given to the apparatus.

The sample hold base 5 is provided above the coarse adjustment stage 3 and the fine adjustment stage 4. The sample hold base 5 mounts vacuum absorber 15 for absorbing sample 16 and mirror 17 for measuring the length between mirror 17 and the sample using a laser.

We will explain hereunder the operation of the apparatus of the present invention.

When the positioning of the sample 16 is to take place, fine adjustment stage 4 is positioned 10 μm below protrusions 3B of coarse adjustment stage 3 using the three Z axis fine adjustment driving structures. In this state, protrusions 3B of the coarse adjustment stage 3 support the sample hold base 5. By operating the electromagnetic chucks 11, sample hold base 5 is adsorbed by the protrusions 3B. In this case, the sample hold base is not necessarily supported by all the protrusions $3B_1$–$3B_n$ in conjunction with the size of the sample hold base, but is supported by at least three electromagnetic chucks on the three protrusions.

After that, the sample hold base 5 is moved stepwise in the directions of the X and Y axes through the X axis coarse adjustment driving structure 6 and the Y axis coarse adjustment driving structure.

Since the coarse adjustment stage 3 of the embodiment moves the sample hold base 5 stepwise by 15 mm within 140 ms, the sample hold base 5 is accelerated by 0.04 G. The adsorbing force of the electromagnetic chucks 11 can be obtained by selecting S20C as a chuck material, soldering chemical nickel plate of 10–20 μm to the material, and applying a current of 0.1–0.2 amperes to coils (not shown). The conventional large-scaled electromagnetic chucks have a current to the coils of approximately 1 ampere. At the current value of 0.1–0.2amperes of the present embodiment, the rising temperature of the coils can be maintained below 0.5 ° C.

After the coarse adjustment is complete, the three Z axis piezoelectric actuators 14 are extended to position the fine adjustment stage 4 10 μm higher than the upper surfaces of the protrusions 3B of the coarse adjustment stage 3. At this time, a switch (not shown) of the electromagnetic chucks 11 of the coarse adjustment stage 3 is turned OFF, and another switch (not shown) of the electromagnetic chucks 13 of the fine adjustment stage 4 is turned ON. In this way, the sample hold base 5 is passed from the coarse adjustment stage to the fine adjustment stage 4 and absorbed by the fine adjustment stage 4. At this time, the coarse adjustment stage is returned back to the initial position.

After that, the fine positioning of the sample hold base 5 on the sample 16 to the directions of $\Delta X$, $\Delta Y$ and $\Delta Z$, the fine rotation adjustment of $\Delta \theta$ and the fine inclination adjustment of $\Delta \lambda$ take place using the piezoelectric actuators 12, 13 and 14 of the X, Y and Z axes.

By repeating the above-mentioned coarse adjustment positioning and fine adjustment positioning, the projection of light and the electron beam lithography of the sample 16 are carried out at each predetermined position of the sample. Since the relative position between the coarse adjustment stage 3 and the sample hold base 5 is stepwise changed with each projection of light and electron beam lithography, the relative position of the protrusions is also stepwise changed.

According to the embodiment of the present invention, the following effects can be obtained.

Since the coarse adjustment stage 3 is independently moved from the fine adjustment stage 4, the load of the driving force of the coarse adjustment stage can be decreased.

Since the sample hold base 5 is adsorbed by at least three protrusions among many protrusions $3B_1$-$3B_n$ of the coarse adjustment stage 3, even when the relative position between the sample hole base 5 and the coarse adjustment stage 3 is changed, the apparatus of the embodiment of the present invention presents cantilever type holding of the sample which results in the overhang of the sample mounted on the sample hold base in one direction. In counter-distinction, the conventional apparatus of this field holds the sample, having cantilever type holding as explained above. Accordingly, the present invention prevents the occurrence of the distortion caused by overhang of the sample hold base 5.

Since the apparatus of the embodiment of the present invention adsorbs the sample hold base 5 by at least three protrusions among the protrusions $3B_1$-$3B_n$, the coarse adjustment stage prevents the activation of the rotation force, when the coarse adjustment stage is advanced directly to the X and Y axes.

Since the electromagnetic chucks 11 of the coarse adjustment stage 3 are dispersively provided, each electromagnetic chuck 11 is small; the generated heat quantity from the electromagnetic chucks 11 is suppressed; the deformation caused by the thermal expansion of the sample hold base 5 is prevented, and the fluctuation of air caused by the generated heat is suppressed so that the error of the length measurement using laser is prevented. Accordingly, highly accurate positioning of the sample is accomplished by the above-mentioned operation.

Since the driving structures 6 and 7 of the X and Y axes of the coarse adjustment stage 3 are separated from the frame 1, the vibration from the driving structures is not transferred to the sample hold base 5 during the movement of the coarse adjustment stage 3 so that the adjusting time, which is necessary for the fine adjustment after the coarse adjustment is complete, is shorten. Specifically, the necessary time for positioning the sample at each single step of each projection of light and electron beam lithography is made within 0.4 sec. including the coarse adjustment of 15 mm during the step movement mentioned above and the fine adjustment occurring after the coarse adjustment.

Although the through holes 4A of the fine adjustment stage 4, which are inserted by the protrusions $3B_1$-$3B_n$, are formed by many rectangular shaped holes $4A_1$-$4A_n$ in the above-mentioned embodiment, the through holes can also be notches. Further, the through holes can alternatively be one hole instead, in which the protrusions $3B_1$-$3B_n$ are accommodated together.

Since the resolution means of the first present invention includes the independent fine adjustment stage from the coarse adjustment stage, and the sample hold base is held by number of protrusions of the coarse adjustment stage, the deflection caused by the overhang of the sample hold base is prevented; stable movements of the X and Y axes of the coarse adjustment stage are maintained. Since the generated heat quantity can be suppressed when the electromagnetic chuck is used, high accurate sample positioning of the sample can be carried out even if the sample hold base is large-scaled.

Since the resolution means of the second feature of the present invention does not transfer the vibration of the driving structures of the X and Y axes to the sample hold base during the movement of the driving structure, the adjusting time during the fine adjustment of the sample, which occurs after the coarse adjustment is finished, is shorten so that the necessary time for positioning and processing the sample is shorten.

What we claim is:

1. An apparatus for positioning a sample by moving the sample in X, Y and Z axes directions: comprising:
   a coarse adjustment stage having a base supported by a coarse adjustment structure for moving the base in a X axis direction and in a Y axis direction and plural protrusions located on an upper surface of the base;
   a fine adjustment stage having a plurality of through holes for moving said plural protrusions freely within the through holes, respectively, and a fine adjustment structure for moving the fine adjustment stage in the X, Y and Z axes directions; and
   a sample hold base supported alternately by said coarse adjustment stage or said fine adjustment stage and transferred from said coarse adjustment stage to said fine adjustment stage or from said fine adjustment stage to said coarse adjustment stage by moving a Z axis moving member.

2. An apparatus for positioning a sample according to claim 1, wherein said fine adjustment stage comprises a sheet of plate and each of the through holes is shaped as an orifice or a notch, respectively in said sheet of plate.

3. An apparatus for positioning a sample according to claim 1, wherein upper surfaces of said plural protrusions of said coarse adjustment stage and an upper surface of said fine adjustment stage have a chuck structure for adsorbing said sample hold base in response to a control signal.

4. A apparatus for positioning a sample according to claim 2, wherein upper surfaces of said plural protrusions of said coarse adjustment stage and an upper surface of said fine adjustment stage have a chuck structure for adsorbing said sample hold base in response to a control signal.

5. An apparatus for positioning a sample according to claim 1, wherein a X axis coarse adjustment driving structure and a Y axis coarse adjustment driving structure of said coarse adjustment stage are isolated from a frame supporting said fine adjustment stage, and said X axis coarse adjustment driving structure and said Y axis coarse adjustment driving structure are connected to said coarse adjustment stage through a connection material.

6. An apparatus for positioning a sample according to claim 2, wherein a X axis coarse adjustment driving structure and a Y axis coarse adjustment driving structure of said coarse adjustment stage are isolated from a frame supporting said fine adjustment stage, and said X axis coarse adjustment driving structure and said Y axis coarse adjustment driving structure are connected to said coarse adjustment stage through a connection material.

7. An apparatus for positioning a sample according to claim 3, wherein a X axis coarse adjustment driving structure and a Y axis coarse adjustment driving structure of said coarse adjustment stage are isolated from a frame supporting said fine adjustment stage, and said X axis coarse adjustment driving structure and said Y axis coarse adjustment driving structure are connected to said coarse adjustment stage through a connection material.

8. An apparatus for positioning a sample according to claim 4, wherein a X axis coarse adjustment driving structure and a Y axis coarse adjustment driving structure of said coarse adjustment stage are isolated from a frame supporting said fine adjustment stage, and said X axis coarse adjustment driving structure and said Y axis coarse adjustment driving structure are connected to said coarse adjustment stage through a connection material.

9. An apparatus for positioning a sample according to claim 5, wherein said connection material comprises a flexible and elastic member.

10. An apparatus for positioning a sample according to claim 6, wherein said connection material comprises a flexible and elastic member.

11. An apparatus for positioning a sample according to claim 7, wherein said connection material comprises a flexible and elastic member.

12. An apparatus for positioning a sample according to claim 8, wherein said connection material comprises a flexible and elastic member.

13. An apparatus for positioning a sample according to claim 1, wherein said fine adjustment stage includes fine adjustment driving structures corresponding to said X, Y and Z axes directions for fine rotation in a plane defined by said X axis direction and said Y axis direction and to control a slope of said fine adjustment stage by differentiating each of three Z axis fine adjustment driving structures by a fine adjustment amount.

14. An apparatus for positioning a sample according to claim 2, wherein said fine adjustment stage includes fine adjustment driving structures corresponding to said X, Y and Z axes directions for fine rotation in a plane defined by said X axis direction and said Y axis direction to control a slope of said fine adjustment stage by differentiating each of three Z axis fine adjustment driving structures by a fine adjustment amount.

15. An apparatus for positioning a sample according to claim 3, wherein said fine adjustment stage includes fine adjustment driving structures corresponding to said X, Y and Z axes directions for fine rotation in a plane defined by said X axis direction and said Y axis direction to control a slope of said fine adjustment stage by differentiating each of three Z axis fine adjustment driving structures by a fine adjustment amount.

16. An apparatus for positioning a sample according to claim 4, wherein said fine adjustment stage includes fine adjustment driving structures corresponding to said X, Y and Z axes directions for fine rotation in a plane defined by said X axis direction and said Y axis direction to control a slope of said fine adjustment stage by differentiating each of three Z axis fine adjustment driving structures by a fine adjustment amount.

17. An apparatus for positioning a sample according to claim 5, wherein said fine adjustment stage includes fine adjustment driving structures corresponding to said X, Y and Z axes directions for fine rotation in a plane defined by said X axis direction and said Y axis direction to control a slope of said fine adjustment stage by differentiating each of three Z axis fine adjustment driving structures by a fine adjustment amount.

18. An apparatus for positioning a sample according to claim 6, wherein said fine adjustment stage includes fine adjustment driving structures corresponding to said X, Y and Z axes directions for fine rotation in a plane defined by said X axis direction and said Y axis direction to control a slope of said fine adjustment stage by differentiating each of three Z axis fine adjustment driving structures by a fine adjustment amount.

19. An apparatus for positioning a sample according to claim 7, wherein said fine adjustment stage includes fine adjustment driving structures corresponding to said X, Y and Z axes directions for fine rotation in a plane defined by said X axis direction and said Y axis direction to control a slope of said fine adjustment stage by differentiating each of three Z axis fine adjustment driving structures by a fine adjustment amount.

20. An apparatus for positioning a sample according to claim 8, wherein said fine adjustment stage includes fine adjustment driving structures corresponding to said X, Y and Z axes directions for fine rotation in a plane defined by said X axis direction and said Y axis direction to control a slope of said fine adjustment stage by differentiating each of three Z axis fine adjustment driving structures by a fine adjustment amount.

21. An apparatus for positioning a sample according to claim 9, wherein said fine adjustment stage includes fine adjustment driving structures corresponding to said X, Y and Z axes directions for fine rotation in a plane defined by said X axis direction and said Y axis direction to control a slope of said fine adjustment stage by differentiating each of three Z axis fine adjustment driving structures by a fine adjustment amount.

22. An apparatus for positioning a sample according to claim 10, wherein said fine adjustment stage includes fine adjustment driving structures corresponding to said X, Y and Z axes directions for fine rotation in a plane defined by said X axis direction and said Y axis direction to control a slope of said fine adjustment stage by differentiating each of three Z axis fine adjustment driving structures by a fine adjustment amount.

23. An apparatus for positioning a sample according to claim 11, wherein said fine adjustment stage includes fine adjustment driving structures corresponding to said X, Y and Z axes directions for fine rotation in a plane defined by said X axis direction and said Y axis direction to control a slope of said fine adjustment stage by differentiating each of three Z axis fine adjustment driving structures by a fine adjustment amount.

24. An apparatus for positioning a sample according to claim 12, wherein said fine adjustment stage includes fine adjustment driving structures corresponding to said X, Y and Z axes directions for fine rotation in a plane defined by said X axis direction and said Y axis direction to control a slope of said fine adjustment stage by differentiating each of three Z axis fine adjustment driving structures by a fine adjustment amount.

* * * * *